United States Patent [19]
Makino

[11] Patent Number: 5,568,559
[45] Date of Patent: Oct. 22, 1996

[54] SOUND PROCESSING APPARATUS

[75] Inventor: Jun Makino, Tokyo, Japan

[73] Assignee: Canon Kabushiki Kaisha, Tokyo, Japan

[21] Appl. No.: 354,951

[22] Filed: Dec. 13, 1994

[30]   Foreign Application Priority Data

Dec. 17, 1993 [JP] Japan ................................. 5-317767
Apr. 26, 1994 [JP] Japan ................................. 6-088438
Apr. 26, 1994 [JP] Japan ................................. 6-088439

[51] Int. Cl.⁶ .................................................. H03G 5/00
[52] U.S. Cl. ................................. 381/98; 381/56; 381/92
[58] Field of Search ............................... 381/92, 94, 26, 381/98, 1, 56, 97, 12, 68.1, 68.5

[56]      References Cited

U.S. PATENT DOCUMENTS 3,854,117  12/1974  Fothergill .
4,195,360   3/1980  Fothergill .
5,214,707   5/1993  Fujimoto et al. ..................... 381/92

FOREIGN PATENT DOCUMENTS 0386765  12/1990  Japan ..................... 381/56

*Primary Examiner*—Forester W. Isen
*Assistant Examiner*—Duc Nguyen
*Attorney, Agent, or Firm*—Robin, Blecker, Daley & Driscoll

[57]               ABSTRACT

A sound processing apparatus in which the levels of audio signals from which have been extracted signals of a frequency band lower than a predetermined frequency band are controlled by using signals of the predetermined frequency band extracted from audio signals that are converted from sound waves generated from a sound source and by using signals that are extracted from the above audio signals and are lying within a frequency band lower than the above predetermined frequency band, and the signals of which the levels are controlled and the audio signals are combined together and are output. The sound processing apparatus is capable of removing noise components such as wind noise from the audio signals despite of its simple constitution.

12 Claims, 13 Drawing Sheets

SOUND PROCESSING APPARATUS

BACKGROUND OF THE INVENTION

1. Field of the Invention

The present invention relates to a sound processing apparatus for processing audio signals that correspond to sound.

2. Description of the Related Art

As an apparatus of this kind, there has heretofore been known a tape recorder or a camera-integrated VTR which records audio signals obtained through a microphone. When sound is recorded outdoors by using the apparatus of this type, however, the microphone picks up the sound of wind in which the microphone is disposed; i.e., so-called wind noise generates.

Since the wind noise chiefly contains low-frequency components, the analog circuit has heretofore been provided with a high-pass filter (HPF) 31 as shown in FIG. 1. When wind is blowing, a switch 34 is operated to remove wind noise.

Another constitution which automatically detects and removes wind noise has been shown in FIG. 2 in which levels of wind noise and of audio signal are detected by detector circuits 46 and 47 through band-pass filters (BPF) 42 and 43, the levels of these signals are compared by a comparator circuit 48, and the time constant of a time-constant circuit 49 is varied depending upon the result of comparison to change over the characteristics of a variable filter 40 in order to remove wind noise.

The above-mentioned conventional sound processing apparatuses, however, involve the following problems.

The apparatus shown in FIG. 1 is simple in constitution, but manipulation of the change-over switch 34 is left to the user. Therefore, an error or delay of the switch operation is likely occur, so the apparatus is not practical.

In the case of the apparatus shown in FIG. 2, wind noise is automatically detected by a means for detecting wind noise. Wind noise is decreased or removed automatically by a variable filter 40 whose characteristics vary depending upon whether the presence of wind noise. However, the variable filter 40, which is constituted by an analog circuit, becomes complex requiring many constituent parts, and makes it difficult to suppress the manufacturing cost and to maintain precision.

Regardless of a difference between these apparatuses, the components of wind noise are concentrated on the lower side of a low-frequency region. Therefore, the filter needs capacitors of large capacitance, which makes it difficult to realize the apparatus in a small size. In the case of an apparatus for processing stereophonic audio signals, in particular, the filters must be provided for the signals of the right and left channels, making it further difficult to accomplish a reduction in the size.

When the entire constitution using a conventional analog filter is modified for processing digital signals, a demerit such as variance can be eliminated but much merit is not expected from the standpoint of cost since the scale of hardware becomes large. Even if it is attempted to carry out this in a software manner by using an arithmetic circuit or the like circuit, the amount of arithmetic operation is so large that the apparatus could not be realized from the standpoint of execution time and limitation in the memory.

Besides, when an audio signal having frequency components similar to wind noise is input at a predetermined level, the above-mentioned conventional detector circuit which simply compares the levels is not capable of discriminating between a wind noise and an audio signal. Moreover, in case the detector circuit has rendered incorrect decision that the input is wind noise, the audio signal to be recorded is removed, which is a problem.

SUMMARY OF THE INVENTION

One object of the present invention is to provide a sound processing apparatus which eliminates the above-mentioned problems.

Another object of the present invention is to provide a sound processing apparatus which removes noise components such as wind noise contained in the audio signals despite of its simple constitution.

In order to accomplish the above objects, the present invention according to an embodiment provides a sound processing apparatus comprising an audio signal output means which converts sound waves generated from a sound source into audio signals and outputs the audio signals, a first extraction means which extracts signals within a predetermined frequency band from audio signals output from the audio signal output means and outputs the extracted signals, a second extraction means which extracts signals within a frequency band lower than the predetermined frequency band from audio signals output from the audio signal output means and outputs the extracted signals, a level control means which controls the levels of the signals output from the second extraction means by using the signals output from the first extraction means and the second extraction means, and outputs the level-controlled signals, and an adder means which combines the audio signals output from the audio signal output means with the signals output from the level control means together and outputs resultant signals.

A further object of the present invention is to provide a sound processing apparatus which correctly discriminates between audio signals and wind noise and detects the generation of wind noise despite of its simple constitution.

In order to accomplish the above-mentioned object according to an embodiment of the present invention, there is provided a sound processing apparatus comprising a plurality of audio signal output means which convert sounds generated from a sound source into audio signals and output the audio signals, a detection means which receives two audio signals output from at least two of said audio signal output means, detects whether the polarities of the two input audio signals and outputs a detection signal that indicates whether their polarities are in agreement or not, and a comparator means which compares a period in which the polarities of the two input audio signals are in agreement with a period in which they are not in agreement at intervals of a predetermined period depending upon the detection signal output from the detection means, and outputs a signal indicating the result of comparison.

A still further object of the present invention is to provide a voice processing apparatus which detects the generation of wind noise correctly and stably without erroneously recognizing low-frequency audio signals as wind noise.

In order to accomplish the above-mentioned object according to an embodiment of the present invention, there is provided a sound processing apparatus comprising a plurality of audio signal output means which convert sounds generated from a sound source into audio signals and output the audio signals, a multiplier means which receives two audio signals output from at least two of said audio signal output means, multiplies the two input audio signals and outputs a multiplication signal indicating the result of multiplication, and a comparator means which compares a period in which multiplication signal output from said multiplier means has positive polarity with a period in which the multiplication signal has negative polarity at intervals of a predetermined period and outputs a signal indicating the result of comparison.

DETAILED DESCRIPTION OF THE PREFERRED EMBODIMENTS

Embodiments of the present invention will now be described in detail in conjunction with the drawings.

Figure 1:
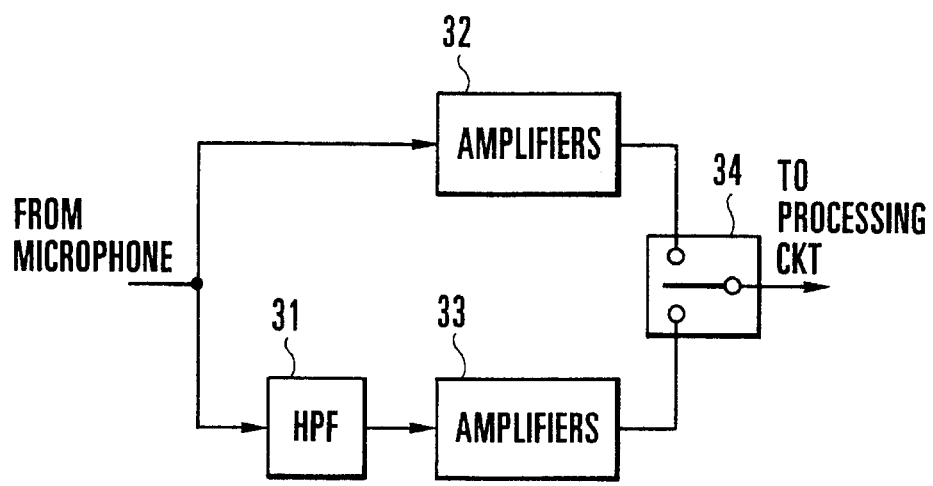
FIG. 1 is a diagram for explaining a prior art.
Figure 2:
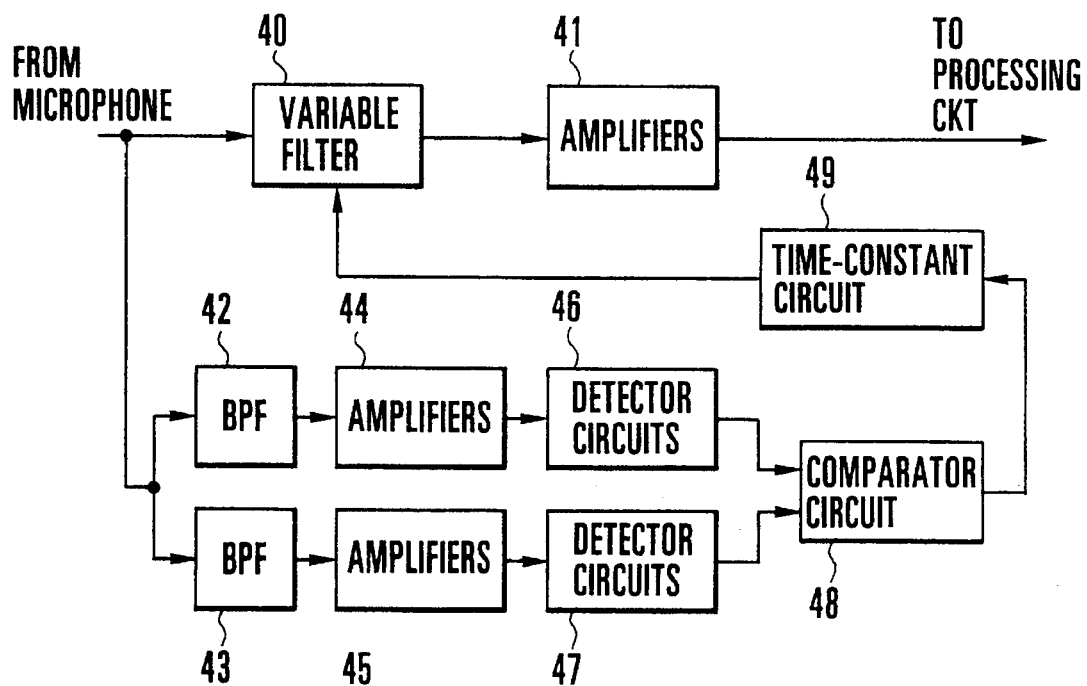
FIG. 2 is a diagram for explaining another prior art.
Figure 3:
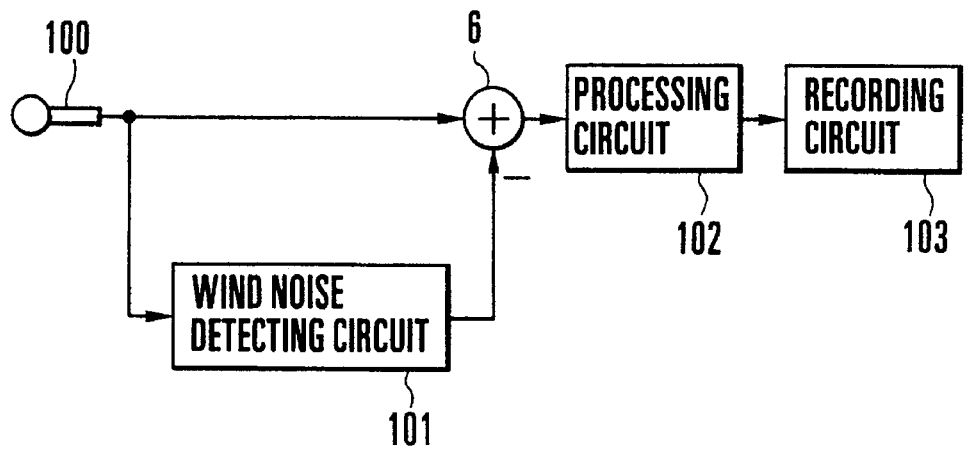
FIG. 3 is a block diagram illustrating the constitution of a sound recording apparatus according to a first embodiment of the present invention.

FIG. 3 is a block diagram illustrating the constitution of a recording apparatus such as a camera-integrated VTR according to a first embodiment of the present invention. FIG. 3 illustrates the sound processing system only.

In FIG. 3, sound picked up by a microphone 100 is converted into an audio signal which is then output of a wind noise detecting circuit 101 and to an adder 6 that will be described below. The wind noise detecting circuit 101 extracts wind noise components only from the audio signals output by the microphone 100, and outputs them to the adder 6. The adder 6 subtracts the wind noise components sent by the wind noise detecting circuit 101 from the audio signal sent from the microphone 100, and outputs the resulting audio signal to a processing circuit 102. The audio signal from the adder is subjected to a predetermined processing in the processing circuit 102 and outputs to a recording circuit 103 which records the audio signal into a recording medium such as a magnetic tape or the like.

Figure 4:
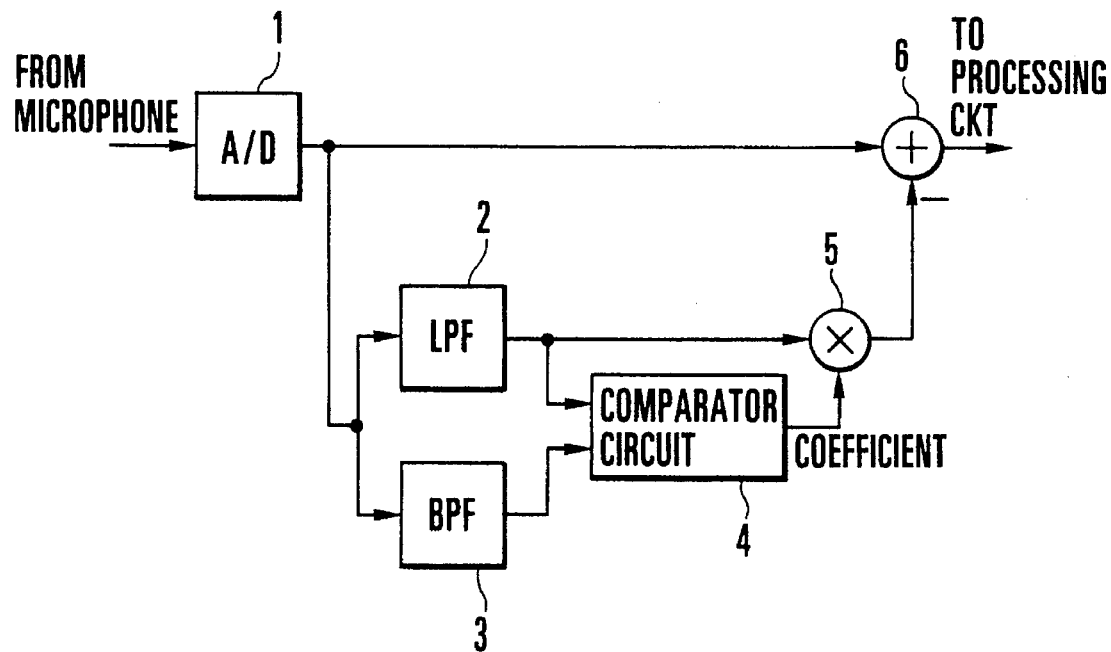
FIG. 4 is a block diagram illustrating the constitution of a wind noise detecting circuit according to the first embodiment of the present invention.

Described below next with reference to FIG. 4 is the constitution of the wind noise detecting circuit of FIG. 3. In FIG. 4, reference numeral 1 denotes an A/D converter for converting audio signals from the microphone 100 into digital audio signals, 2 denotes a low-pass filter (hereinafter referred to as LPF) for extracting low-frequency components from the digital audio signals, and 3 denotes a BPF for extracting a certain frequency region of audio signals. These two filters constitute a digital filter which directly receive digital audio signals from the A/D converter 1. Reference numeral 4 denotes a comparator circuit which compares the output of the LPF 2 with the output of the BPF 3 to detect magnitude of the wind noise, and determines the coefficient of a multiplier 5, and reference numeral 6 denotes an adder which inverts the output of the multiplier 5 and adds it to the output of the A/D converter 1.

Figure 5:
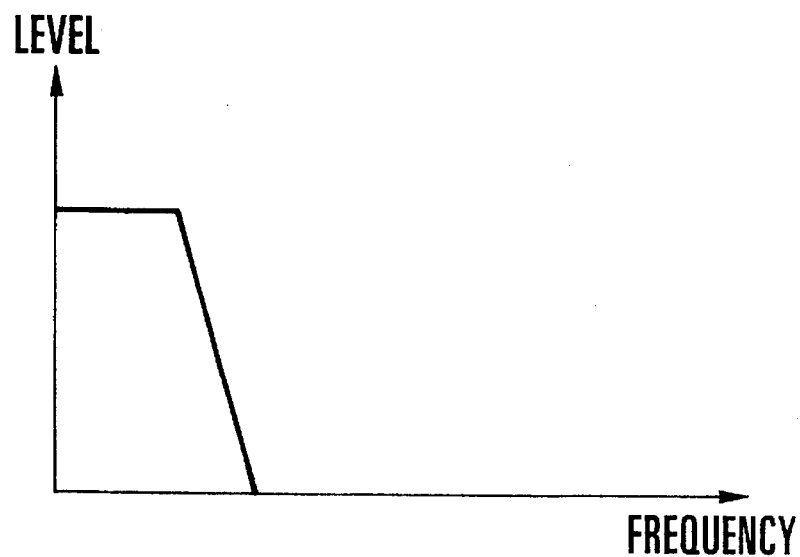
FIG. 5 is a diagram showing characteristics of a low-pass filter in the circuit of FIG. 4.

Described below is a step for detecting and removing wind noise by the thus constitute wind noise detecting circuit. The audio signal picked up by the microphone 100 is converted together with wind noise into a digital signal through the A/D converter 1, and is output to the LPF 2 and to the BPF 3. The LPF 2 extracts signals of frequencies lower than those of audio signals from the input signals. FIG. 5 shows frequency characteristics of the LPF 2. The wind noise is mostly concentrated in a low-frequency region and, hence, wind noise only can be extracted by the LPF 2 from the audio signals.

Figure 6:
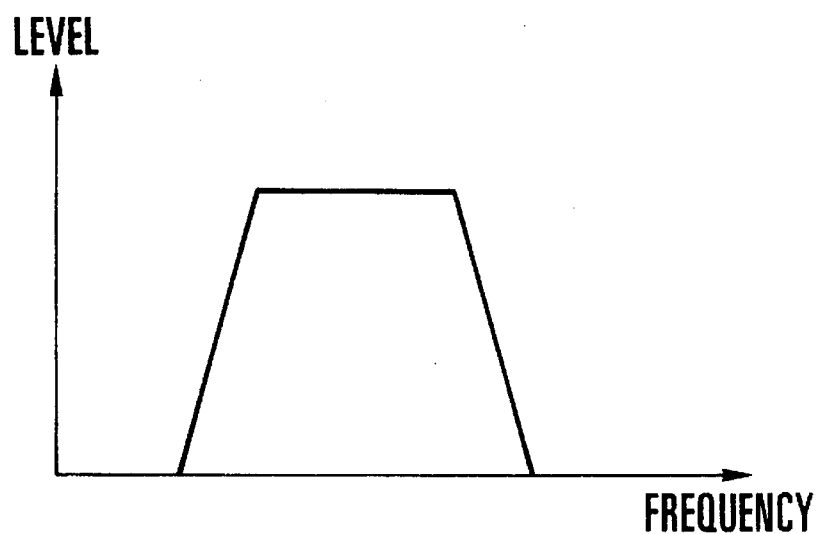
FIG. 6 is a diagram showing characteristics of a band-pass filter in the circuit of FIG. 4.

The BPF 3, on the other hand, extracts audio signals only from the input signals. FIG. 6 shows characteristics of the BPF 3 which removes wind noise and undesired signals of a high-frequency band from the input signals and extracts the required audio signals only.

The signals output from the LPF 2 and BPF 3 are input to the comparator circuit 4 which compares the levels of these signals and determines the coefficient of the multiplier circuit 5. The coefficient is determined according to a method described below. First, the level of a signal output from the BPF 3 is compared with a predetermined level. This is based on the assumption than when the level of the output signal of the BPF 3 is larger than the predetermined level, then, the audio signal has a large level. This level is considered to be larger than the low-frequency components in the audio signals. Therefore, the level of low-frequency signals to be subtracted through the adder 6 is set to be small, so that audio signals in the low-frequency region remain. When the output of the BPF 3 is smaller than the predetermined level, and a difference is small between the output level of the LPF 2 and the output level of the BPF 3, it is so considered that the audio signals have a small level and most of the low-frequency components are those of wind noise. Therefore, a relatively large value corresponding to the level of output signals of the LPF 2 is output to the multiplier 5 in order to increase the level of low-frequency components that are to be subtracted through the adder 6. When the output level of the BPF 3 is smaller than the predetermined level and the difference is large between the output level of the LPF 2 and the output level of the BPF 3, it is so considered that the audio signals have a small level and wind noise is small, too. Therefore, a relatively small value corresponding to the level of output signals of the LPF 2 is output to the multiplier 5 to decrease the level of low-frequency components that are to be subtracted through the adder 6.

As described above, the level-controlled audio signals of low-frequency components are subtracted through the adder 6 from the output signals of the A/D converter 1, thereby to obtain audio signals free of wind noise.

According to this embodiment as described above, the level of low-frequency components is controlled to properly detect and remove mind noise depending upon the level of audio signals. According to this embodiment, furthermore, the filters, comparator circuit, multiplier and adder are all constituted by digital circuits to prevent the signal levels from varying depending upon the elements, so that noise is removed more precisely than the apparatus made up of analog circuits. Furthermore, operations for detecting and removing noise are carried out using a simple constitution made up of filters, adder, and the like.

A second embodiment of the present invention will now be described with reference to FIG. 7. This embodiment deals with a case for processing signals from sterephonic microphones.

In this case, the microphone 100 of FIG. 3 serves as stereophonic microphones, and audio signals from the right and left separate microphones are processed by the circuits in the subsequent stages. The same constituent elements as those of FIG. 4 are denoted by the same reference numerals but are not described here again.

Figure 7:
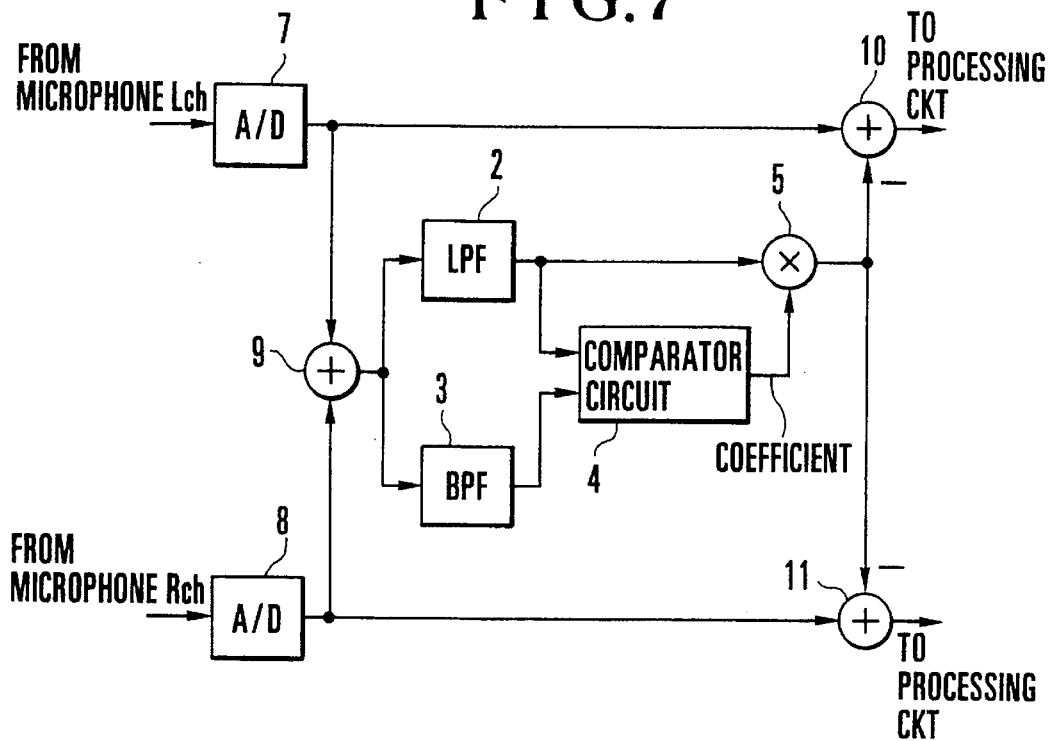
FIG. 7 is a block diagram illustrating the constitution of the wind noise detecting circuit according to a second embodiment of the present invention.

In FIG. 7, a signal from a microphone of the left channel (microphone Lch) and a signal from a microphone of the right channel (microphone Rch) are converted into digital signals through A/D converters 7 and 8, respectively. Output signals of the A/D converters 7 and 8 are fed to adders 9, 10 and 11. The adder 9 adds up the output signals from the A/D converters 7 and 8, and sends an output to LPF 2 and BPF 3. The subsequent operation for detecting wind noise is the same as that of the aforementioned first embodiment. In this embodiment, however, the signal used for detecting the wind noise is obtained by adding up the right and left input signals, and the comparator circuit 4 outputs a coefficient that is determined by taking this fact into consideration.

The output signal from the multiplier 5 is subtracted through the adders 10 and 11 from the outputs of the A/D converters 7 and 8. As a result, the adders 10 and 11 output signals obtained by removing wind noise from audio signals of the right and left channels.

According to this embodiment as described above, the LPF for extracting the wind noise is also used for removing noise of the right and left channels in the detection stage, contributing to decreasing the number of constituent elements. Therefore, the noise that is removed becomes different from the noise detected in one channel. In practice, however, components of the wind noise almost all lie in a low-frequency region and, hence, there exists a very little difference between the right channel and the left channel; i.e., noise is removed without any problem from a practical point of view.

A third embodiment of the present invention will now be described with reference to FIG. 8. This embodiment deals with the case for processing stereophonic signals from microphones of an MS (mid and side) system.

In this case, the microphone 100 of FIG. 3 serves as an MS microphone, and audio signals from microphones of the mid position and the side position are processed through the circuits in the subsequent stages.

Figure 8:
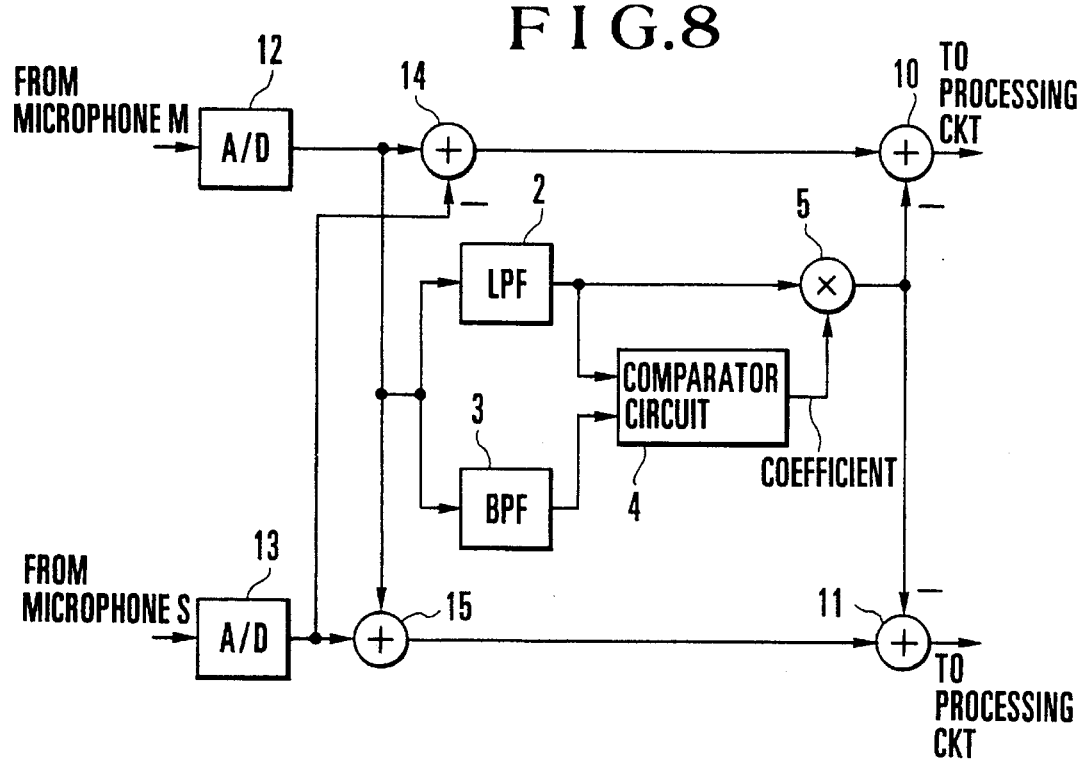
FIG. 8 is a block diagram illustrating the constitution of the wind noise detecting circuit according to a third embodiment of the present invention.

In FIG. 8, an audio signal from the microphone of the mid position and an audio signal from the microphone of the side position are converted into digital signals through the A/D converters 12 and 13, respectively. In this embodiment, only the output from the microphone of the mid position, i.e., only the output signal from the A/D converter 12 is input to the noise detection system. The signal from the A/D converter 12 and the signal obtained by converting the output of the microphone of the side position through the A/D converter 13 are converted into right and left signals (sum signal, difference signal) through a matrix circuit including inverting adders 14 and 15, and are output to the adders 10 and 11. The operation for detecting wind noise hereinafter is the same as the operation mentioned in the foregoing embodiment. In this embodiment, however, a signal of the mid position only is used for detecting wind noise, and the comparator circuit 4 outputs a coefficient that is determined by taking this fact into consideration.

The output signal from the multiplier 5 is subtracted from the outputs of the A/D converters 12 and 13 through the adders 10 and 11. As a result, the adders 10 and 11 output signals that are obtained by removing wind noise from the audio signals of the right and left channels.

In this embodiment, the LPF for extracting the wind noise is also used for removing noise of the right and left channels in the detection stage, contributing to decreasing the number of constituent elements.

Described below is a fourth embodiment of the present invention in conjuration with FIG. 9.

This embodiment uses a HPF 16 and an inverting adder 17 instead of the LPF 2 and BPF 3 used in the foregoing embodiments. Other constituent elements are the same as those of the aforementioned first embodiment.

Figure 9:
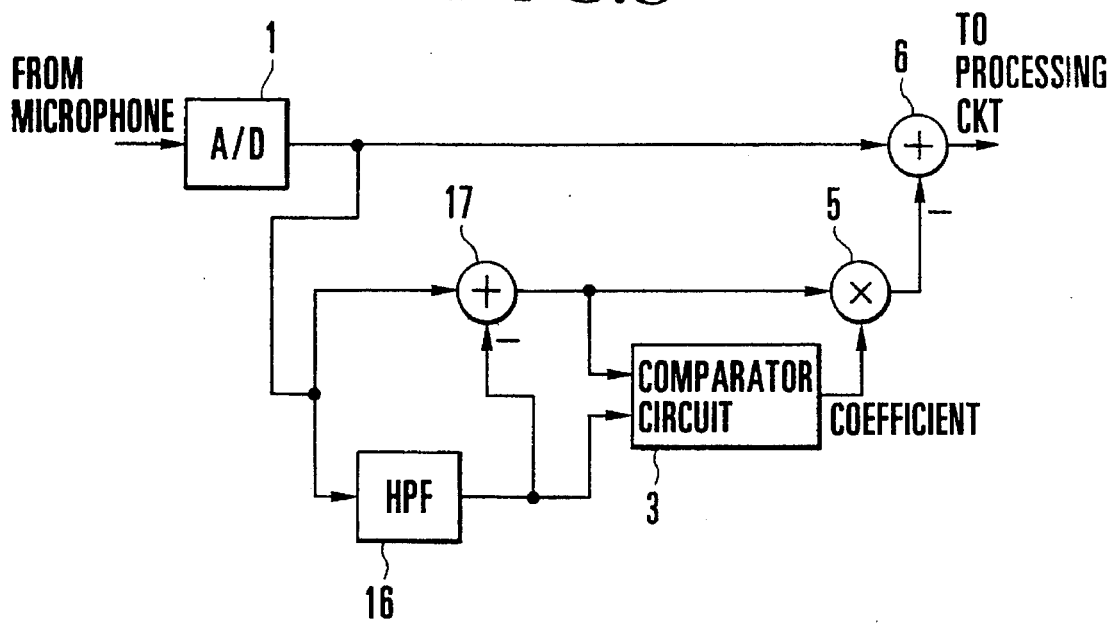
FIG. 9 is a block diagram illustrating the constitution of the wind noise detecting circuit according to a fourth embodiment of the present invention.
Figure 10:
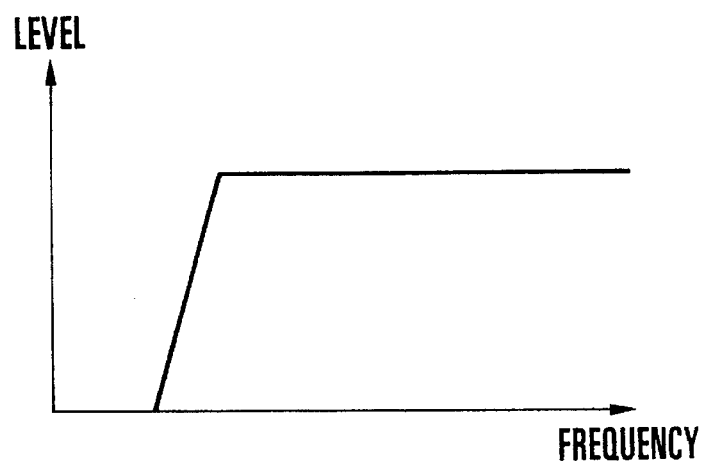
FIG. 10 is a diagram showing characteristics of a high-pass filter in the circuit of FIG. 9.

In FIG. 9, the output signal from the A/D converter 1 is input to the HPF 16 and to the adder 17. The HPF 16 extracts signals of frequencies higher than those of wind noise from the input signals. FIG. 10 shows characteristics of the HPF 16. Since the components of wind noise are almost all concentrated in a low-frequency region, the high-pass filter outputs the input signals from which frequency components containing wind noise are eliminated.

The inverting adder 17 inverts the output signal of the HPF 16 and adds it to the input signal, i.e., subtracts the output signal of the HPF 16 from the input signal. Thus, there is extracted, as an output signal of the adder 17, a signal that contains wind noise only. The operation hereinafter is the same as that of the aforementioned first embodiment.

According to this embodiment as described above, though the precision for detecting wind noise and audio signals is lower than that of the first embodiment, detection and removal of wind noise are realized by providing only one filter which is constituted in a small size. This makes it possible to practically remove wind noise using a simply constituted circuitry.

Described below is a fifth embodiment of the present invention in conjunction with FIG. 11.

This embodiment uses an inverting adder 18 in place of the BPF 3 used in the foregoing embodiment. Other constituent elements are the same as those of the aforementioned first embodiment.

Figure 11:
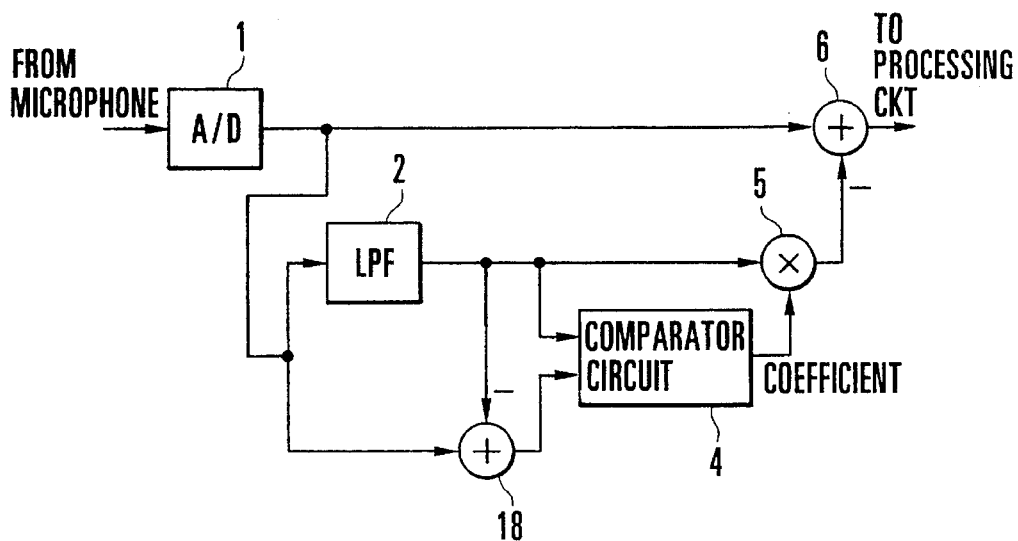
FIG. 11 is a block diagram illustrating the constitution of the wind noise detecting circuit according to a fifth embodiment of the present invention.

In FIG. 11, the output signal from the A/D converter 1 is input to the LPF 2 and to the adder 18. The LPF 2 exhibits the same characteristics as those of the aforementioned first embodiment and extracts wind noise only from the input signals. The inverting adder 18 subtracts the output signal of the LPF 2 from the input signal. Therefore, there is extracted, as the output signal of the adder 18, a signal from which wind noise components are removed, i.e., there is extracted frequency components that include many audio signals. The operation hereinafter is the same as that of the aforementioned first embodiment.

In this embodiment, detection and removal of wind noise are realized by providing only one filter which is constituted in a small size. This makes it possible to practically remove wind noise using a simply constituted circuitry.

Described below is a sixth embodiment of the present invention in conjunction with FIG. 12. This embodiment uses an HPF 16, an LPF 20 and an inverting adder 21 instead of the LPF 2 and BPF 3 used in the above-mentioned embodiment. Other constituent elements are the same as those of the aforementioned first embodiment.

Figure 12:
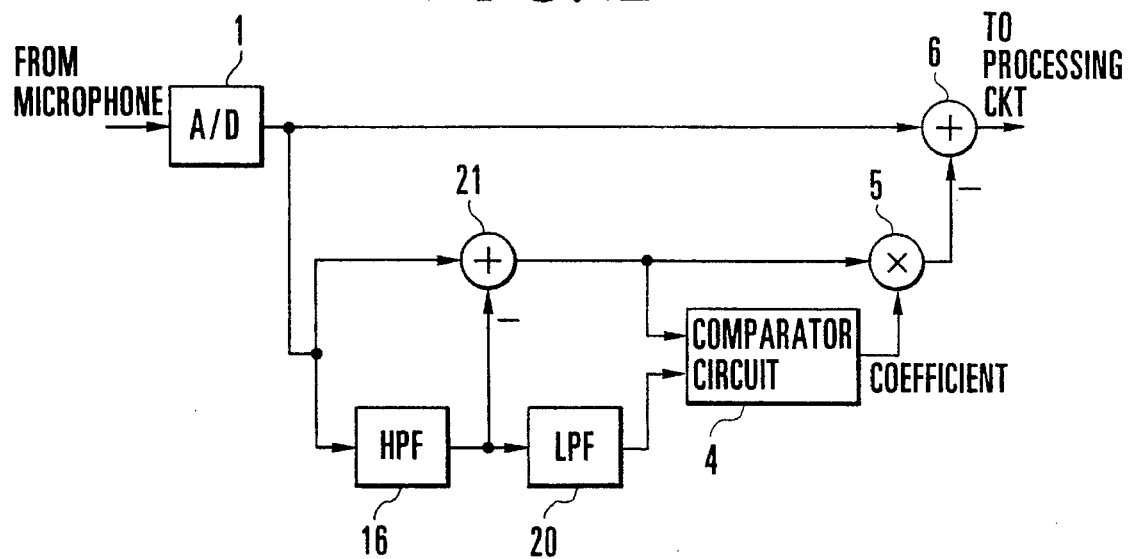
FIG. 12 is a block diagram illustrating the constitution of the wind noise detecting circuit according to a sixth embodiment of the present invention.
Figure 13:
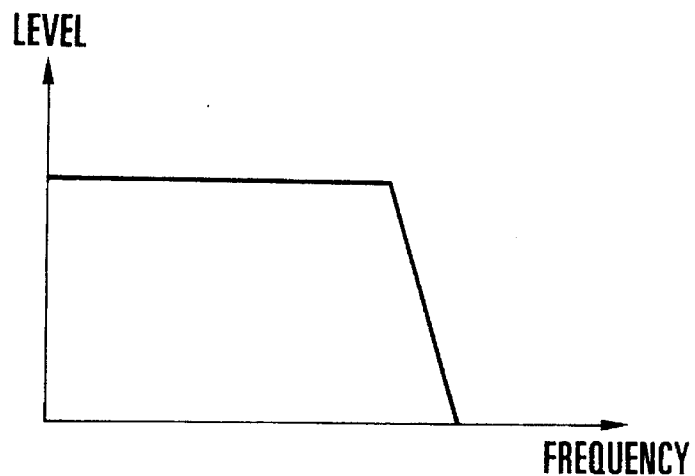
FIG. 13 is a diagram showing characteristics of a low-pass filter in the circuit of FIG. 12.

In FIG. 12, the output signal from the A/D converter 1 is input to the adder 6, HPF 16 and adder 21. The HPF 16 exhibits the same characteristics as those of the aforementioned fourth embodiment, and extracts signals of frequencies higher than those of wind noise from the input signals. These signals are output to the LPF 20 and the adder 21. The LPF 20 extracts signals of frequencies lower than those of audio signals from the input signals. FIG. 13 shows characteristics of the LPF 20. The LPF 20 removes undesired high-frequency components from the input signals and extracts required audio signals only. The inverting adder 21 inverts the output signal of the HPF 16 and adds it to the input signal, i.e., subtracts the output signal of the HPF 16 from the input signal. Therefore, there is extracted, as the output signal of the adder 21, a signal containing wind noise only. The operation hereinafter is the same as that of the aforementioned first embodiment.

This embodiment is constituted without using a bulky band-pass filter of an ordinary constitution, and makes it possible to practically remove wind noise despite of its compact constitution.

Described below is a seventh embodiment of the present invention in conjunction with FIG. 14.

This embodiment uses an LPF 20 and an inverting adder 22 in place of the BPF 3 used in the aforementioned first embodiment. Other constituent elements are the same as those of the aforementioned first embodiment.

Figure 14:
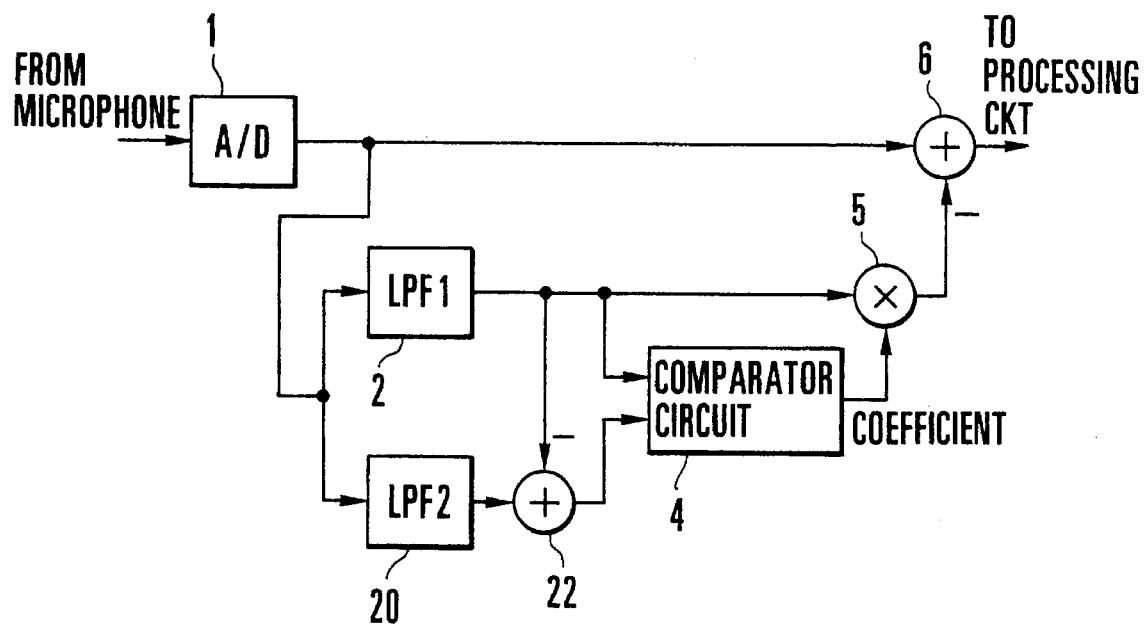
FIG. 14 is a block diagram illustrating the constitution of the wind noise detecting circuit according to a seventh embodiment of the present invention.

In FIG. 14, the output signal of the A/D converter 1 is input to the adder 6, LPF 2 and LPF 20. The LPF 2 has characteristics same as those of the aforementioned first embodiment and extracts signals of frequencies of wind noise components from the input signals. The LPF 20 exhibits the same characteristics as those of the aforementioned sixth embodiment, removes undesired high-frequency components from the input signals, and extracts required audio signals only. The inverting adder 22 inverts the output signal of the LPF 2 and adds it to the output signal of the LPF 20, i.e., subtracts the output signal of the LPF 2 from the output signal of the LPF 20. There are thus extracted signals from which wind noise components are removed, i.e., there are extracted frequency components containing many audio signals. The operation hereinafter is the same as that of the first embodiment.

This embodiment is constituted without using a bulky band-pass filter of an ordinary constitution, and makes it possible to practically remove wind noise despite of its compact constitution.

According to the first to seventh embodiment of the present invention as will be obvious from the foregoing description, signals of low frequencies to be removed and ordinary audio signals having higher frequencies are extracted from the input signals, levels of low-frequency signals are controlled by using the extracted audio signals only, and then the original signals and the extracted audio signals are combined. Thus, signals of frequencies to be removed such as of wind noise are removed from the original signals by using a simply constituted circuitry.

An eighth embodiment of the present invention will now be described.

Figure 15:
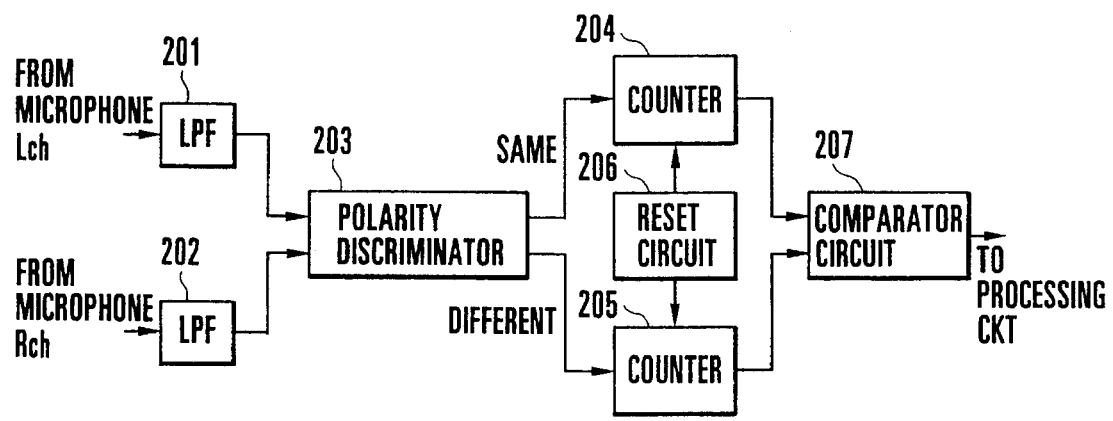
FIG. 15 is a diagram illustrating the constitution according to an eight embodiment of the present invention.

FIG. 15 is a diagram illustrating the constitution of the eighth embodiment of the present invention.

In FIG. 15, reference numerals 201 and 202 denoted low-pass filters (hereinafter referred to as LPFs) which extract low-frequency components only from the input audio signals. That is, since frequency components of wind noise are deviated to a low-frequency region, the LPFs can extract signals of frequency components in which are contained wind noise.

Reference numeral 203 denotes a polarity discriminator which discriminates polarities of signals output from the LPFs 201 and 202, and outputs a signal representing "1" to a same polarity counter 204 and outputs a signal representing "0" to a different polarity counter 205 when the polarities of signals output from the LPFs 201 and 202 are the same like positive and positive or negative and negative, and outputs a signal representing "0" to the same polarity counter 204 and outputs a signal representing "1" to the different polarity counter 205 when the polarities of signals output from the LPFs 201 and 202 are different like positive and negative or negative and positive.

Reference numeral 204 denotes the same polarity counter for counting signals having the same polarity, and 205 denotes the different polarity counter for counting signals having different polarities. Both the same polarity counter 204 and the different polarity counter 205 count the signals representing "1" output from the polarity discriminator 203 and add up the counted values. The counted values of these counters 204 and 205 are reset at predetermined intervals by a reset signal from a reset circuit 206 at predetermined intervals to count the degrees in which the same polarity and different polarities are exhibited within a predetermined period of time by the signals output from the LPFs 201 and 202.

Reference numeral 207 denotes a comparator circuit which compares the counted values output from the counters 204 and 205 at predetermined intervals, outputs a signal which indicates that no wind noise is generated when the counted value of the counter 204 is larger and outputs a signal which indicates the generation of wind noise when the counted value of the counter 205 is larger.

Described below is a method of discriminating whether the signal is wind noise or sound having low-frequency components according to the embodiment.

Figure 16:
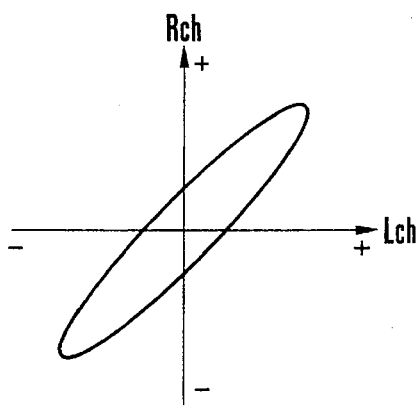
FIG. 16 is a diagram showing, on two-dimensional coordinates, the left-side level and the right-side level of stereophonic audio signals of when ordinary sounds generated from a sound source are picked up by using stereophonic microphones.

FIG. 16 is a diagram illustrating on two-dimensional coordinates formed by an axis representing the levels of audio signals output from a microphone of the left channel and by an axis representing the levels of audio signals output from a microphone of the right channel, stereophonic audio signals output from the microphones of the right and left channels that are picking up ordinary sounds from a sound source.

An ellipse shown in FIG. 16 illustrates the levels of audio signals output from the microphone of the left channel and microphone of the right channel of when sounds from the sound source are incident nearly perpendicular to the front surface of the two microphones.

When the sound source nearly faces the front of the surfaces of the two microphones as shown in FIG. 16, the sounds of nearly the same phase are input to the microphone of the left channel and to the microphone of the right channel, representing an inclination that rises toward the right at an angle of +45 degrees. When the sound source is deviated toward the microphone of the left side or toward the microphone of the right side, the inclination changes accompanying the movement of the sound source though the inclination remains in the positive region. Even when the sound source is located being opposed to the microphone of the left channel or to the microphone of the right channel, the inclination simply remains along the axis of the left channel or along the axis of the right channel.

Figure 17:
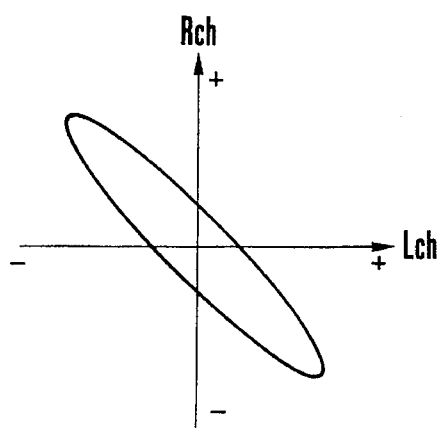
FIG. 17 is a diagram showing, on two-dimensional coordinates, the left-side level and the right-side level of stereophonic audio signals of when sounds containing much wind noise are picked up by using stereophonic microphones.

When the two microphones are exposed in a wind and generated wind noise, no correlation exists between the audio signal output from the microphone of the left channel and the audio signal output from the microphone of the right channel. FIG. 17 is a diagram illustrating the audio signals of this case on two-dimensional coordinates formed by an axis representing levels of audio signals output from the microphone of the left channel and by an axis representing levels of audio signals output from the microphone of the right channel like in the case of ordinary sounds.

As shown in FIG. 17, when there is no correlation between the audio signal output from the microphone of the left channel and the audio signal output from the microphone of the right channel, the inclination descends toward the right at an angle of −45 degrees in an extreme case.

When viewed instantaneously, therefore, the audio signal output from the microphone of the left channel and the audio signal output from the microphone of the right channel, in the case of ordinary stereophonic sounds, appear much on a first quadrant and on a fourth quadrant of the two-dimensional coordinates formed by an axis representing the levels of audio signals output from the microphone of the left channel and by an axis representing the levels of audio signals output from the microphone of the right channel, and possess the same polarity. In the case of wind noise, the audio signals appear much on a second quadrant and on a third quadrant of the two-dimensional coordinates, and have different polarities.

Therefore, this embodiment detects polarities of an audio signal output from the microphone of the left channel and of an audio signal output from the microphone of the right channel at intervals of a predetermined period, and compares the magnitudes of a period in which the same polarity is exhibited and of a period in which different polarities are exhibited, thereby to distinguish whether it is wind noise or sound having low-frequency components.

Here, it is presumed that DC offset has been removed from audio signals output from the microphone of the left channel and from the microphone of the right channel.

A ninth embodiment of the present invention will now be described with reference to FIG. 18 which is a diagram illustrating the constitution of the ninth embodiment.

Figure 18:
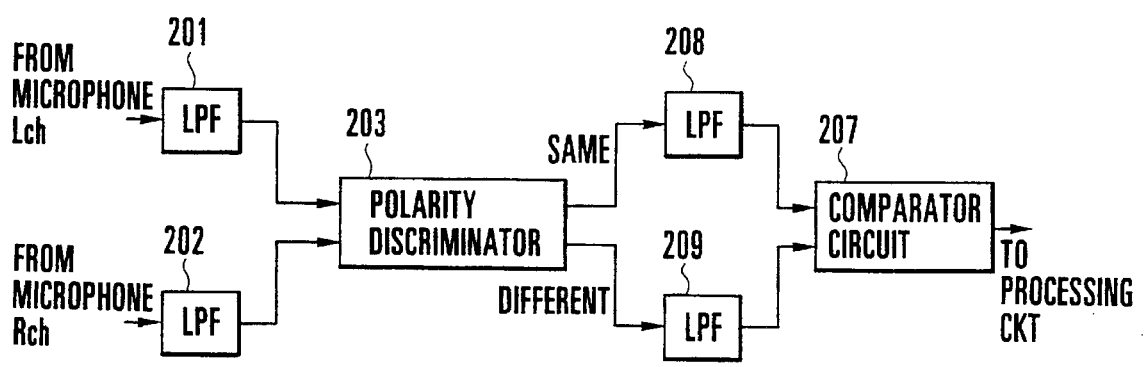
FIG. 18 is diagram illustrating the constitution according to a ninth embodiment of the present invention.

In FIG. 18, reference numerals 201 and 202 denote LPFs which extract low-frequency components only from the input audio signals. That is since the frequency components of wind noise are deviated toward a low-frequency region, the signals of frequency components of wind noise can be extracted by the LPFs.

Reference numeral 203 denotes a polarity discriminator which discriminates polarities of signals output from the LPFs 201 and 202, and outputs a signal representing "1" to a same polarity LPF 208 and outputs a signal representing "0" to a different polarity LPF 209 when the polarities of signals output from the LPFs 201 and 202 are the same like positive and positive or negative and negative, and outputs a signal representing "0" to the same polarity LPF 208 and outputs a signal representing "1" to the different polarity LPF 209 when the polarities of signals output from the LPFs 201 and 202 are different like positive and negative or negative and positive.

Reference numeral 208 represents the same polarity LPF for smoothing signals representing the same polarity, and 209 denotes the different polarity LPF for smoothing signals representing different polarities. When, for instance, the signals output from the LPFs 201 and 202 exhibit the same polarity for a long period of time and the polarity discriminator 203 feeds many signals "1" to the same polarity LPF 208 and feeds many signals "0" to the different polarity LPF 209, the level of the output signal of the same polarity LPF 208 approaches "1" and the level of the output signal of the different polarity LPF 209 approaches "0". On the other hand, when the signals output from the LPFs 201 and 202 exhibit different polarities for a long period of time and the polarity discriminator 203 feeds many signals "0" to the same polarity LPF 208 and feeds many signals "1" to the different polarity LPF 209, the level of the output signal of the same polarity LPF 208 approaches "0" and the level of the output signal of the different polarity LPF 209 approaches "1".

Therefore, the ratio between a period in which the signals output from the LPFs 201 and 202 exhibit the same polarity and a period in which the signals exhibit different polarities can be found from the levels of signals output from the LPFs 208 and 209.

Reference numeral 207 denotes a comparator circuit which compares the levels of signals output from the LPFs 208 and 209 at predetermined intervals, outputs a signal which indicates that no wind noise is generated when the signal level output from the LPF 208 is larger and outputs a signal which indicates the generation of wind noise when the signal level of the LPF 209 is larger.

In the ninth embodiment, the period for detecting the generation of wind noise is determined by time constants of LPFs 208 and 209.

A tenth embodiment of the present invention will now be described with reference to FIG. 19 which is a diagram illustrating the constitution of the tenth embodiment.

Figure 19:
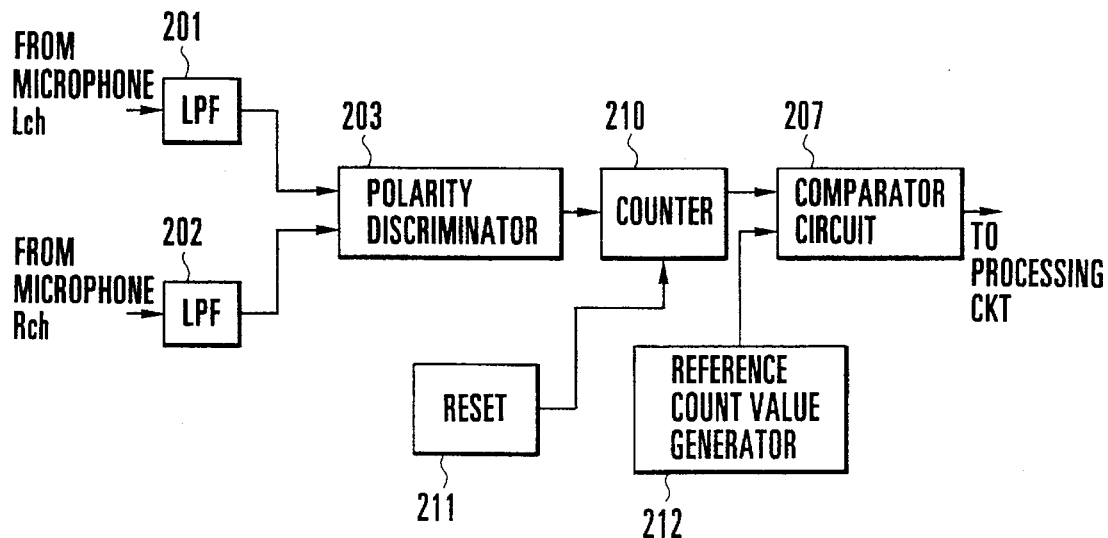
FIG. 19 is a diagram illustrating the constitution according to a tenth embodiment of the present invention.

In FIG. 19, reference numerals 201 and 202 denote LPFs which extract low-frequency components only from the input audio signals. Since the frequency components of wind noise are deviated toward a low-frequency region, the LPFs extract signals of frequency components of wind noise.

Reference numeral 203 denotes a polarity discriminator which discriminates polarities of signals output from the LPFs 201 and 202, and outputs a signal representing "0" to a counter 210 when the polarities of signals output from the LPFs 201 and 202 are the same like positive and positive or negative and negative, and outputs a signal representing "1" to the counter 210 when the polarities of signals output from the LPFs 201 and 202 are different like positive and negative or negative and positive.

Reference numeral 210 denotes a counter for counting different polarities, and counts the signals representing "1" output from the polarity discriminator 203 and adds up the counted value. The value counted by the counter 210 is reset at predetermined intervals, by reset signal output from the reset circuit 211 at predetermined intervals and counts a degree in which different polarities are exhibited within a predetermined period of time by the signals output from the LPFs 201 and 202.

Reference numeral 207 denotes a comparator circuit which compares the counted value output from the counter 210 with a predetermined reference count value output from reference count value generator 312, and outputs a signal representing that no wind noise is generating when the reference count value is larger and outputs a signal representing the generation of wind noise when the counted value of the counter 210 is larger.

The tenth embodiment needs only one counter for counting the ratio between a period in which the same polarities are exhibited by the signals output from the LPFs 201 and 202 of the aforementioned eighth embodiment and a period in which different polarities are exhibited. Therefore, the tenth embodiment is suited for simplifying the circuit constitution and for decreasing the manufacturing cost.

According to this embodiment, furthermore, quite the same effects can be obtained even by using the polarity discriminator 203 which discriminates the polarities of signals output from the LPFs 201 and 202, outputs a signal representing "1" to the counter 210 when the signals output from the LPFs 201 and 202 exhibit the same polarities like positive and positive or negative and negative, and outputs a signal representing "0" to the counter 210 when the signals output from the LPFs 201 and 202 exhibit different polarities like positive and negative or negative and positive.

An eleventh embodiment of the present invention will now be described with reference to FIG. 20 which is a diagram illustrating the constitution of the eleventh embodiment.

Figure 20:
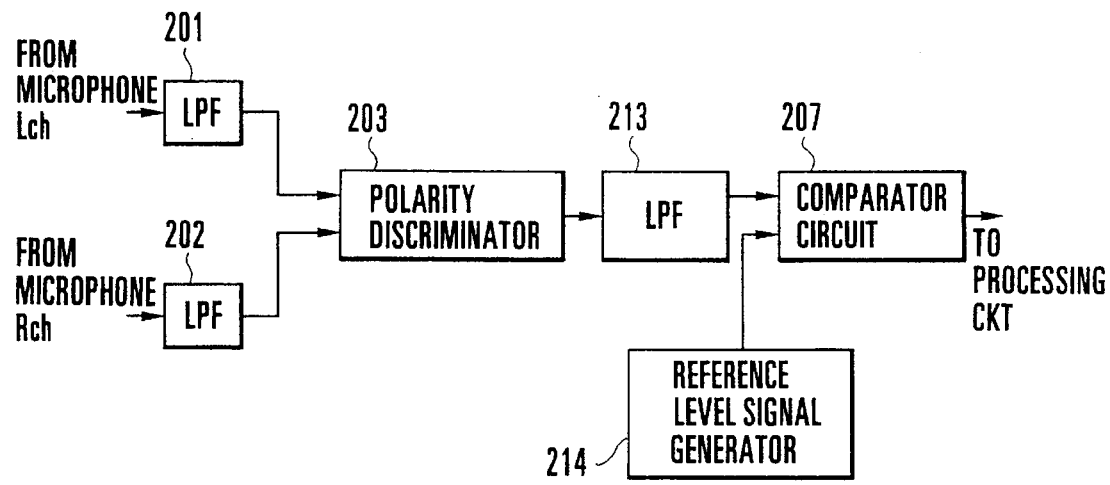
FIG. 20 is a diagram illustrating the constitution according to an eleventh embodiment of the present invention.

In FIG. 20, reference numeral 201 and 202 denote LPFs which extract low-frequency components only from the input audio signals. Since the frequency components of wind noise are deviated toward a low-frequency region, the LPFs extract signals of frequency components of wind noise.

Reference numeral 203 denotes a polarity discriminator which discriminates polarities of signals output from the LPFs 201 and 202, and outputs a signal representing "0" to an LPF 213 when the polarities of signals output from the LPF 201 and 202 are the same like positive and positive or negative and negative, and outputs a signal representing "1" to the LPF 213 when the polarities of signals output from the LPFs 201 and 202 are different like positive and negative or negative and positive.

Reference numeral 213 represents the LPF for smoothing signals representing the same polarity. When, for instance, the signals output from the LPFs 201 and 202 exhibit the same polarity for a long period of time and the polarity discriminator 203 feeds many signals "0" to the LPF 213, the level of the output signal of the LPF 213 approaches "0". On the other hand, when the signals output from the LPFs 201 and 202 exhibit different polarities for a long period of time and the polarity discriminator 203 feeds many signals "1" to the LPF 213, the level of the output signal of the LPF 213 approaches "1".

Therefore, a degree in which different polarities are exhibited by the signals output from the LPFs 201 and 202 can be found from the levels of signals output from the LPF 213.

Reference numeral 207 denotes a comparator circuit which compares the level of a signal output from the LPF 213 with a signal having a predetermined reference level output from a reference level signal generator 214, and outputs a signal representing that no wind noise is generating when the level of the signal output from the reference level signal generator 214 is larger and outputs a signal representing the generation of wind noise when the level of the signal output from the LPF 213 is larger.

In the eleventh embodiment, the period for detecting the generation of wind noise is determined by a time constant of the LPF 213.

The eleventh embodiment needs only one LPF for smoothing the signals that exhibit a period in which the same polarity is exhibited by the signals output from the LPFs 201 and 202 of the aforementioned ninth embodiment and for smoothing the signals that exhibit a period in which different polarities are exhibited. Therefore, the eleventh embodiment is suited for simplifying the circuit constitution and for decreasing the manufacturing cost.

According to this embodiment, furthermore, quite the same effects can be obtained even by using the polarity discriminator 203 which discriminates the polarities of signals output from the LPFs 201 and 202, outputs a signal representing "1" to the LPF 213 when the signals output from the LPFs 201 and 202 exhibit the same polarities like positive and positive or negative and negative, and outputs a signal representing "0" to the LPF 213 when the signals output from the LPFs 201 and 202 exhibit different polarities like positive and negative or negative and positive.

According to the eighth to eleventh embodiments of the present invention as described above, a period in which the polarities are in agreement between the audio signals of the left side and the audio signals of the right side of the stereophonic audio signals and a period in which the polarities are not in agreement are detected at predetermined intervals, and it is so judged that the wind noise is generating when the polarities are not in agreement between the audio signals of the left side and the audio signals of the right side within a predetermined period of time. Thus, there is provided a sound processing apparatus which is capable of correctly and stably detecting the generation of wind noise without erroneously recognizing the audio signals having low-frequency components as wind noise.

Figure 21:
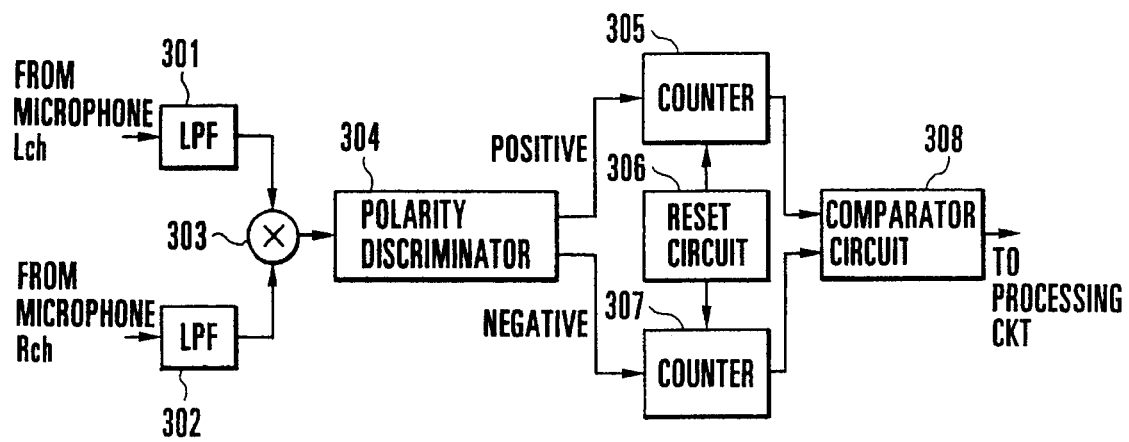
FIG. 21 is a diagram illustrating the constitution according to a twelfth embodiment of the present invention.

A twelfth embodiment of the present invention will no be described. FIG. 21 is a diagram illustrating the constitution of the twelfth embodiment of the present invention.

In FIG. 21, reference numerals 301 and 302 denotes low-pass filters (hereinafter referred to as LPFs) which extract low-frequency components only from the input audio signals. Since the frequency components of wind noise are deviated toward a low-frequency region, the LPFs extract signals of frequency components of wind noise.

Reference numeral 303 denoted a multiplier which multiplies signals output from the LPFs 301 and 302, and outputs a signal representing the result of multiplication.

Reference numeral 304 denotes a polarity discriminator which discriminates the polarity of a signal output from the multiplier 303, outputs a signal representing "1" to a positive polarity counter 305 and outputs a signal representing "0" to a negative polarity counter 307 when the signal output from the multiplier 303 has a positive polarity, and outputs a signal representing "0" to the positive polarity counter 305 and outputs a signals representing "1" to the negative polarity counter 307 when the signal output from the multiplier 303 has a negative polarity.

Reference numeral 305 denotes the positive polarity counter for counting signals having positive polarity, and 307 denotes the negative polarity counter for counting signals having negative polarity. Both the positive polarity counter 305 and the negative polarity counter 307 count signals representing "1" output from the polarity discriminator 304, and add up the counted values. The values counted by these counters 305 and 307 are reset at predetermined intervals by a reset signal output at predetermined intervals from a reset circuit 306 in order to find degrees in which the positive polarity and the negative polarity are exhibited within a predetermined period of time by the signals output from the multiplier 303.

Reference numeral 308 denotes a comparator circuit which compares the counted values output from the counters 305 and 307 at predetermined intervals, outputs a signal representing that no wind noise is generated when the counted value of the counter 305 is larger and outputs a signal representing the generation of wind noise when the counted value of the counter 307 is larger.

Described below is a method of discriminating whether the signal is wind noise or sound having low-frequency components according to the embodiment.

Figure 22:
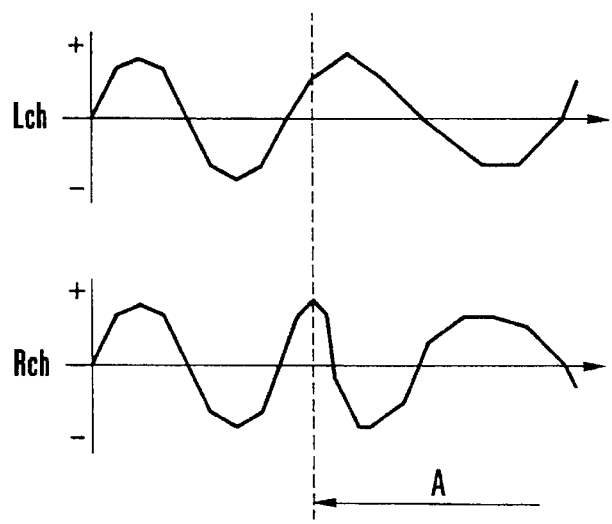
FIG. 22 is a diagram showing audio signals of the left side and audio signals of the right side of stereophonic audio signals in the case when sounds generated from a sound source are picked up by using stereophonic microphones.

FIG. 22 is a diagram illustrating audio signals output from a microphone of the left channel and audio signals output from a microphone of the right channel in the case where a sound generated from a sound source is picked up by stereophonic microphones constituted by the microphone of the left channel (left side) and the microphone of the right channel (right side).

In FIG. 22, the sound from the sound source is incident nearly perpendicular to the front surfaces of the two microphones. Furthermore, during a period A in FIG. 22, the wind blows against the two microphones, and audio signals are output from the microphone of the left channel and from the microphone of the right channel in a state where wind noise is being generated.

When the sound source nearly faces the front of the two microphones as shown in FIG. 22, nearly the same sounds are input to the microphone of the left channel and to the microphone of the right channel. During the period in which the two microphones receive no wind, therefore, audio signals of nearly the same waveform are output from the two microphones.

In this state, when the sound source is deviated toward the left or the right with respect to the two microphones, phases of audio signals output from the two microphones are deviated accompanying the motion of the sound source and signal waveforms become different. The signal waveforms, however, do not become different so conspicuously.

Moreover, deviation in phase between the audio signal output from the microphone of the left channel and the audio signal output from the microphone of the right channel may stem from a gap maintaining which the microphone of the left channel and the microphone of the right channel are installed. However, when the sound produced from a sound source contains low-frequency components, the gap maintaining which the microphones are installed affects very little the phase difference between the audio signals output from the two microphones, and there results no large difference in phase between the audio signal output from the microphone of the left channel and the audio signal output from the microphone of the right channel.

When the wind blows against the two microphones causing them to generate wind noise, no correlation exists between the audio signal output from the microphone of the left channel and the audio signal output from the microphone of the right channel, and signal waveforms are both disturbed as in the period A in FIG. 22.

Figure 23:
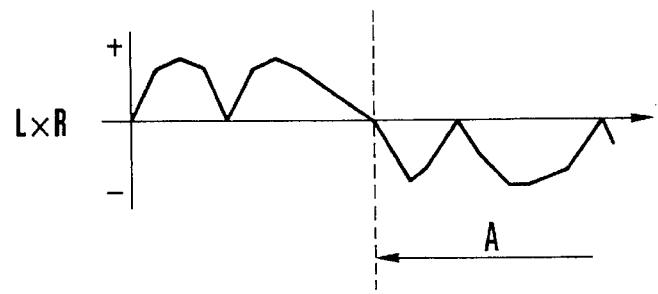
FIG. 23 is a diagram showing waveforms of signals that are obtained by multiplying signals output from a left-channel microphone by signals output from a right-channel microphone shown in FIG. 22.

FIG. 23 is a diagram illustrating the waveform of a signal obtained by multiplying a signal output from the microphone of the left channel by a signal output from the microphone of the right channel shown in FIG. 22.

When the two microphones receive no wind and when no wind noise is generating as shown in FIG. 23, almost no phase difference exists between the audio signal output from the microphone of the left channel and the audio signal output from the microphone of the right channel. Accordingly, negative polarity does not almost generate in a multiplied value of audio signals output from the two microphones. When the wind strikes the two microphones causing them to generate wind noise, there exists no correlation between the audio signal output from the microphone of the left channel and the audio signal output from the microphone of the right channel and, hence, negative polarity easily generates in a multiplied value of audio signals output from the two microphones.

According to this embodiment, therefore, polarity of a multiplied value of an audio signal from the microphone of the left channel and an audio signal from the microphone of the right channel is detected at predetermined intervals, and magnitudes of a period in which positive polarity is exhibited and of a period in which negative polarity is exhibited are compared in order to distinguish whether the audio signal is that of wind noise or of sound containing low-frequency components.

It is here assumed that DC offset has been removed from voice signals output from the microphone of the left channel and from the microphone of the right channel.

A thirteenth embodiment of the present invention will now be described with reference to FIG. 24 which is a diagram showing the constitution of the thirteenth embodiment.

Figure 24:
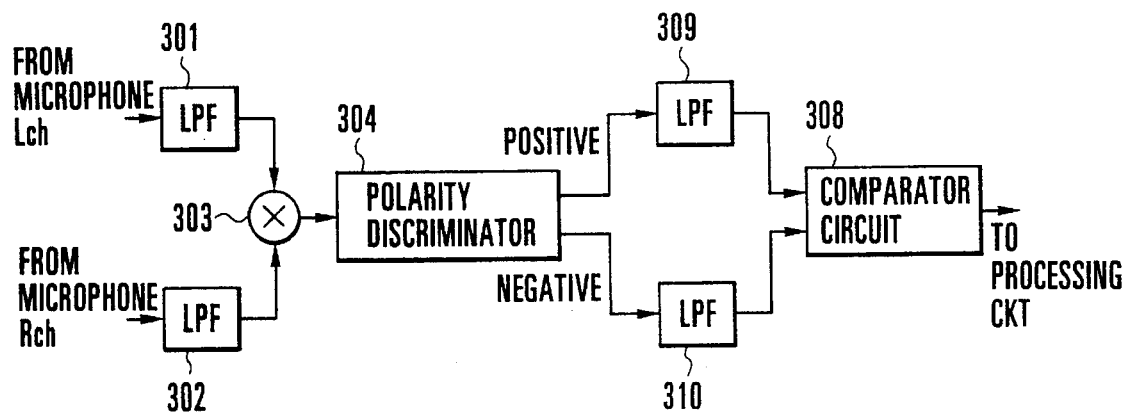
FIG. 24 is a diagram illustrating the constitution according to a thirteenth embodiment of the present invention.

In FIG. 24, reference numerals 301 and 302 denote LPFs which extract low-frequency components only from the input audio signals. Since the frequency components of wind noise are deviated toward a low-frequency region, the LPFs extract signals of frequency components containing wind noise.

Reference numeral 303 denotes a multiplier which multiplies signals output from the LPFs 301 and 302, and outputs a signal representing the result of multiplication.

Reference numeral 304 denotes a polarity discriminator which discriminates the polarity of a signal output from the multiplier 303, outputs a signal representing "1" to a positive polarity LPF 309 and outputs a signal representing "0" to a negative polarity LPF 310 when the signal output from the multiplier 303 has a positive polarity, and outputs a signal representing "0" to the positive polarity LPF 309 and outputs a signal representing "1" to the negative polarity LPF 310 when the signal output from the multiplier 303 has a negative polarity.

Reference numeral 309 denotes the positive polarity LPF for smoothing signals having positive polarity, and 310 denotes the negative polarity LPF for smoothing signals having negative polarity. When, for instance, the signals output from the multiplier 303 exhibit positive polarity for a long period of time and the polarity discriminator 304 feeds many signals "1" to the positive polarity LPF 309 and feeds many signals "0" to the negative polarity LPF 310, the level of the output signal of the LPF 309 approaches "1" and the level of the output signal of the LPF 310 approaches "0". On the other hand, when the signals output from the multiplier 303 exhibit negative polarity for a long period of time and the polarity discriminator 304 feeds many signals "0" to the positive polarity LPF 309 and feeds many signals "1" to the negative polarity LPF 310, the level of the output signal of the positive polarity LPF 309 approaches "0" and the level of the output signal of the negative polarity LPF 3 10 approaches "1".

Therefore, the degrees in which the positive polarity is exhibited and the negative polarity is exhibited by the signals output from the multiplier 303 can be found from the levels of signals output from the LPFs 309 and 310.

Reference numeral 308 denotes a comparator circuit which compares the levels of signals output from the LPFs 309 and 310, and outputs a signal representing that no wind noise is generating when the level of the signal output from the LPF 309 is larger and outputs a signal representing the generation of wind noise when the level of the signal output from the LPF 310 is larger.

In the thirteenth embodiment, the period for detecting the generation of wind noise is determined by time constants of the LPFs 309 and 310.

A fourteenth embodiment of the present invention will now be described with reference to FIG. 25 which is a diagram illustrating the constitution of the fourteenth embodiment.

Figure 25:
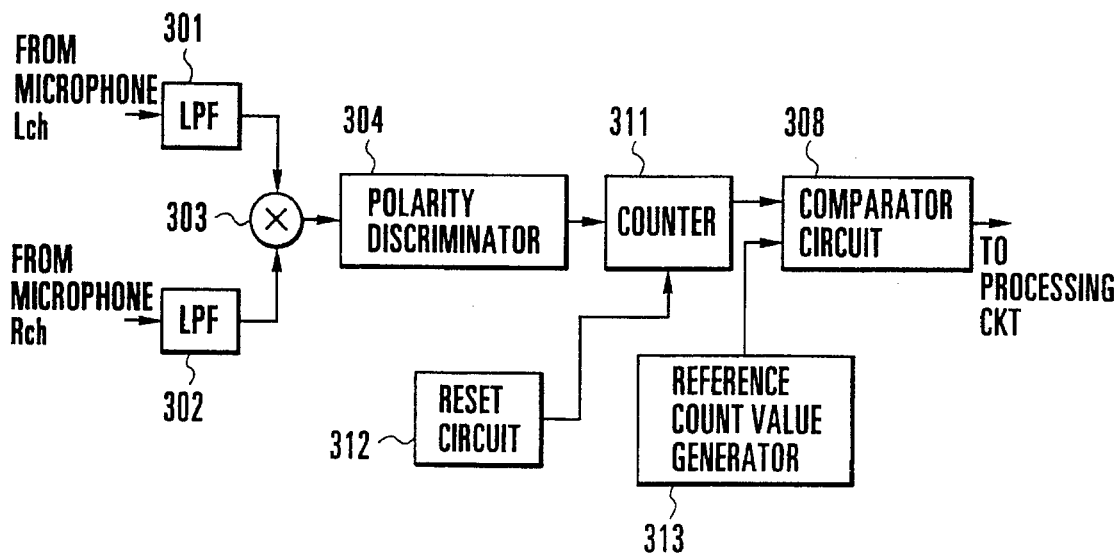
FIG. 25 is a diagram illustrating the constitution according to a fourteenth embodiment of the present invention.

In FIG. 25, reference numerals 301 and 302 denote LPFs which extract low-frequency components only from the input audio signals. Since the frequency components of wind noise are deviated toward a low-frequency region, signals of frequency components of wind noise can be extracted by the LPFs.

Reference numeral 303 denotes a multiplier which multiplies the signals output from the LPFs 301 and 302, and outputs a signal representing the result of multiplication.

Reference numeral 304 denotes a polarity discriminator which discriminates the polarity of a signal output from the multiplier 303, outputs a signal representing "0" to a counter 311 when the signal output from the multiplier 303 has positive polarity, and outputs a signal representing "1" to the counter 311 when the signal output from the multiplier 303 has negative polarity.

Reference numeral 311 denotes the counter for counting signals having negative polarity, and counts signals "1" output from the polarity discriminator 304 and adds up the counted value. The counted value of the counter 311 is reset at predetermined intervals by a reset signal output at predetermined intervals from a reset circuit 312 to find a degree in which the negative polarity is exhibited within a predetermined period of time by the signals output from the multiplier 303.

Reference numeral 308 denotes a comparator circuit which compares the counted value output from the counter 311 with the magnitude of a reference count value output from a reference count value generator 313, outputs a signal representing that no wind noise is generating when the reference count value is larger and outputs a signal representing the generation of wind noise when the value counted by the counter 311 at is larger.

The fourteenth embodiment needs only one counter for counting a period in which the signals output from the multiplier 303 of the twelfth embodiment exhibit positive polarity and a period in which the signals exhibit negative polarity, and is suited for simplifying the circuit constitution and for decreasing the manufacturing cost.

In this embodiment, furthermore, the same effects can be obtained even by using a polarity discriminator 304 which discriminates the polarity of a signal output from the multiplier 303, outputs a signal representing "1" to the counter 311 when the signal output from the multiplier 303 has positive polarity, and outputs a signal representing "0" to the counter 311 when the signal output from the multiplier 303 has negative polarity.

A fifteenth embodiment of the present invention will now be described with reference to FIG. 26 which is a diagram illustrating the constitution according to the fifteenth embodiment.

Figure 26:
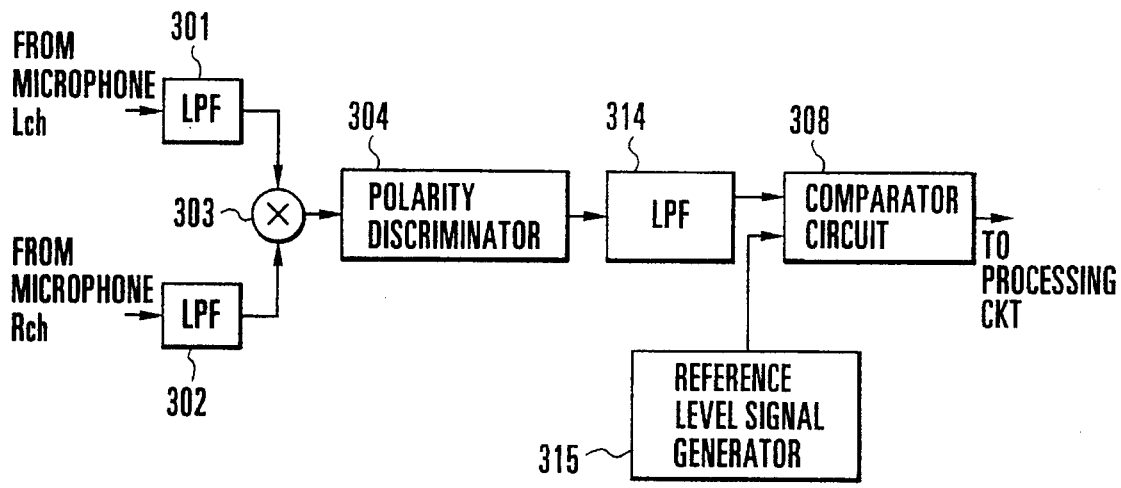
FIG. 26 is a diagram illustrating the constitution according to a fifteenth embodiment of the present invention.

In FIG. 26, reference numerals 301 and 302 denote LPFs which extract low-frequency components from the input audio signals. Since the frequency components of wind noise are deviated toward a low-frequency region, signals of frequency components of wind noise are extracted by the LPFs.

Reference numeral 303 denotes a multiplier which multiplies signals output from the LPFs 301 and 302 and outputs a signal representing the result of multiplication.

Reference numeral 304 denotes a polarity discriminator which discriminates the polarity of a signal output from the multiplier 303, outputs a signal representing "0" to an LPF 314 when the signal output from the multiplier 303 has positive polarity, and outputs a signal representing "1" to an LPF 314 when a signal output from the multiplier 303 has negative polarity.

Reference numeral 314 denotes the LPF for smoothing signals of negative polarity. When, for example, the signals output from the multiplier 303 exhibit positive polarity for an extended period of time and the discriminator 304 feeds many signals representing "0" to the LPF 314, the level of the output signal of LPF 314 approaches "0". When the signals output from the multiplier 303 exhibit negative polarity for an extended period of time and the polarity discriminator 304 feeds many signals representing "1", the level of the output signal of the LPF 314 approaches "1".

Therefore, a degree in which the negative polarity is exhibited by the signals output from the multiplier 303 can be found from the levels of signals output from the LPF 314.

Reference numeral 308 denotes a comparator circuit which compares the level of signal output from the LPF 314 with a predetermined level of a signal output from a reference level signal generator 315, outputs a signal representing that no wind noise is generating when the level of a signal output from the reference level signal generator 315 is larger, and outputs a signal representing the generation of wind noise when the level of a signal output from the LPF 314 is larger.

In the fifteenth embodiment, the period of detecting the generation of wind noise is determined by a time constant of the LPF 314.

The fifteenth embodiment needs only one LPF for smoothing signals of positive polarity and signals of negative polarity output from the multiplier 303 of the thirteenth embodiment, and is suited for simplifying the circuit constitution and for decreasing the manufacturing cost.

In this embodiment, furthermore, the same effects can be obtained even by using a polarity discriminator 304 which discriminates the polarity of a signal output from the multiplier 303, outputs a signal representing "1" to the LPF 314 when the signal output from the multiplier 303 has positive polarity, and outputs a signal representing "0" to the LPF 314 when the signal output from the multiplier 303 has negative polarity.

According to the twelfth to fifteenth embodiments of the present invention as described above, a period in which the positive polarity is exhibited by a signal formed by multiplying an audio signal of the left side by an audio signal of the right side of stereophonic audio signals and a period in which the negative polarity is exhibited are detected at predetermined intervals, and when the signals formed by multiplying audio signals of the left side and audio signals of the right side are exhibiting negative polarity for an extended period of time, it is so judged that the wind noise is generating. Thus, there is provided a sound processing apparatus which is capable of correctly and stably detecting the generation of wind noise without erroneously recognizing the audio signals having low-frequency components as wind noise.

What is claimed is:

1. A sound processing apparatus comprising:
   (A) a plurality of audio signal output means which convert sounds generated from a sound source into audio signals and output the audio signals;
   (B) a detection means which receives two audio signals output from at least two of said audio signal output means, detects whether the polarities of the two input audio signals are in agreement or not, and outputs a detection signal that indicates whether their polarities are in agreement or not; and
   (C) a comparator means which compares a period in which the polarities of the two input audio signals are in agreement with a period in which they are not in agreement at predetermined intervals depending upon the detection signal output from the detection means, and outputs a signal indicating the result of comparison.

2. A sound processing apparatus comprising:
   (A) a plurality of audio signal output means which convert sounds generated from a sound source into audio signals and output the audio signals;
   (B) a detection means which receives two audio signals output from at least two of said audio signal output means, detects whether the polarities of the two input audio signals are in agreement or not at intervals of a predetermined period, and outputs a detection signal that indicates a period in which the polarities are in agreement; and
   (C) a comparator means which compares the length of a period indicated by the detection signal output from said detection means with a reference value, and outputs a signal indicating the result of comparison.

3. A sound processing apparatus comprising:
   (A) a plurality of audio signal output means which convert sounds generated from a sound source into audio signals and output the audio signals;
   (B) a detection means which receives two audio signals output from at least two of said audio signal output means, detects whether the polarities of the two input audio signals are in agreement or not at predetermined intervals, and outputs a detection signal that indicates a period in which the polarities are not in agreement; and
   (C) a comparator means which compares the length of a period indicated by the detection signal output from said detection means with a reference value, and outputs a signal indicating the result of comparison.

4. A sound processing apparatus comprising:
   (A) a plurality of audio signal output means which convert sounds generated from a sound source into audio signals and output the audio signals;
   (B) a detection means which receives two audio signals output from at least two of said audio signal output means, detects whether the polarities of the two input audio signals are in agreement or not, and outputs a detection signal that indicates whether the polarities are in agreement or not;
   (C) a smoothing means which smoothes the detection signal output from said detection means and outputs the smoothed signal; and
   (D) a comparator means which compares a period in which the polarities of the two input audio signals are in agreement with a period in which the polarities are not in agreement according to the detection signal smoothed by said smoothing means at predetermined intervals, and outputs a signal indicating the result of comparison.

5. A sound processing apparatus comprising:
   (A) a plurality of audio signal output means which convert sound generated from a sound source into audio signals and output the audio signals;
   (B) a detection means which inputs two audio signals output from at least two of said audio signal output means, detects whether the polarities of the two input audio signals are in agreement or not at predetermined intervals, and outputs a detection signal that indicates whether the polarities are in agreement or not;
   (C) a smoothing means which smoothes the detection signal output from said detection means and outputs the smoothed signal; and
   (D) a comparator means which compares the length of a period indicated by the smoothed signal from said smoothing means with a reference value, and outputs a signal representing the result of comparison.

6. A sound processing apparatus comprising:
   (A) a plurality of audio signal output means which convert sounds generated from a sound source into audio signals and output the audio signals;
   (B) a detection means which receives two audio signals output from at least two of said audio signal output means, detects whether the polarities of the two input audio signals are in agreement or not at predetermined intervals, and outputs a detection signal that indicates a period in which the polarities are not in agreement;

(C) a smoothing means which smoothes the detection signal output from said detection means and outputs the smoothed signal; and (D) a comparator means which compares the length of a period indicated by the smoothed signal from said smoothing means with a reference value, and outputs a signal representing the result of comparison.

7. A sound processing apparatus comprising:

(A) a plurality of audio signal output means which convert sounds generated from a sound source into audio signals and output the audio signals;

(B) a multiplier means which receives two audio signals output from at least two of said audio signal output means, multiplies the two input audio signals and output a multiplication signal indicating the result of multiplication; and (C) a comparator means which compares a period in which the multiplication signal output from said multiplier means has positive polarity with a period in which the multiplication signal has negative polarity at predetermined intervals, and outputs a signal indicating the result of comparison.

8. A sound processing apparatus comprising:

(A) a plurality of audio signal output means which convert sound generated from a sound source into audio signals and output the audio signals;

(B) a multiplier means which receives two audio signals output from at least two of said audio signal output means, multiplies the two input audio signals and outputs a multiplication signal indicating the result of multiplication; and (C) a comparator means which detects a period in which a signal output from said multiplier means has positive polarity or a period in which the signal has negative polarity at predetermined intervals, compares the length of the period in which the signal has positive polarity with a reference value, and outputs a signal indicating the result of comparison.

9. A sound processing apparatus comprising:

(A) a plurality of audio signal output means which convert sounds generated from a sound source into audio signals and output the audio signals;

(B) a multiplier means which receives two audio signals output from at least two of said audio signal output means, multiplies the two input audio signals and outputs a multiplication signal indicating the result of multiplication; and (C) a comparator means which detects a period in which a signal output from said multiplier means has positive polarity or a period in which the signal has negative polarity at predetermined intervals, compares the length of the period in which the signal has negative polarity with a reference value, and outputs a signal indicating the result of comparison.

10. A sound processing apparatus comprising:

(A) a plurality of audio signal output means which convert sounds generated from a sound source into audio signals and output the audio signals;

(B) a multiplier means which receives two audio signals output from at least two of said audio signal output means, multiplies the two input audio signals and outputs a multiplication signal indicating the result of multiplication;

(C) a smoothing means which smoothes the multiplication signal output from said multiplication means and outputs the smoothed multiplication signal; and (D) a comparator means which compares a period in which the multiplication signal smoothed by said smoothing means has positive polarity with a period in which the multiplication signal has negative polarity at predetermined intervals, and outputs a signal indicating the result of comparison.

11. A sound processing apparatus comprising:

(A) a plurality of audio signal output means which convert sounds generated from a sound source into audio signals and output the audio signals;

(B) a multiplier means which receives two audio signals output from at least two of said audio signal output means, multiplies the two input audio signals and outputs a multiplication signal indicating the result of multiplication;

(C) a smoothing means which smoothes the multiplication signal output from said multiplication means and outputs the smoothed multiplication signal; and (D) a comparator means which compares the length of a period in which the multiplication signal smoothed by said smoothing means has positive polarity with a reference value at predetermined internals, and outputs a signal indicating the result of comparison.

12. A sound processing apparatus comprising:

(A) a plurality of audio signal output means which convert sounds generated from a sound source into audio signals and output the audio signals;

(B) a multiplier means which receives two audio signals output from at least two of said audio signal output means, multiplies the two input audio signals and outputs a multiplication signal indicating the result of multiplication;

(C) a smoothing means which smoothes the multiplication signal output from said multiplication means and outputs the smoothed multiplication signal; and (D) a comparator means which compares the length of a period in which the multiplication signal smoothed by said smoothing means has negative polarity with a reference value at predetermined internals, and outputs a signal indicating the result of comparison.

* * * * *